(12) United States Patent
Oshima et al.

(10) Patent No.: US 7,793,035 B2
(45) Date of Patent: Sep. 7, 2010

(54) MEMORY SYSTEM AND CONTROLLER

(75) Inventors: Takashi Oshima, Chiba (JP); Makoto Moriya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 714 days.

(21) Appl. No.: 11/690,367

(22) Filed: Mar. 23, 2007

(65) Prior Publication Data
US 2007/0234004 A1 Oct. 4, 2007

(30) Foreign Application Priority Data
Mar. 31, 2006 (JP) ............................ 2006-098377

(51) Int. Cl.
*G06F 12/00* (2006.01)
*G06F 13/00* (2006.01)
*G06F 13/28* (2006.01)
*G11C 29/00* (2006.01)

(52) U.S. Cl. .................... 711/103; 714/718; 365/201

(58) Field of Classification Search .................. None
See application file for complete search history.

(56) References Cited

U.S. PATENT DOCUMENTS

2005/0039095 A1* 2/2005 Guettaf ..................... 714/726
2005/0160216 A1* 7/2005 Norman et al. .............. 711/5
2005/0257109 A1* 11/2005 Averbuj et al. ............ 714/733
2005/0281105 A1 12/2005 Oshima
2006/0064537 A1 3/2006 Oshima
2006/0107072 A1* 5/2006 Umezu et al. .............. 713/193
2006/0271729 A1 11/2006 Oshima

FOREIGN PATENT DOCUMENTS

JP 2004-158098 6/2004

OTHER PUBLICATIONS

U.S. Appl. No. 12/239,179, filed Sep. 26, 2008, Ozawa et al.

* cited by examiner

*Primary Examiner*—Pierre-Michel Bataille
*Assistant Examiner*—Ralph A Verderamo, III
(74) *Attorney, Agent, or Firm*—Oblon, Spivak, McClelland, Maier & Neustadt, L.L.P.

(57) ABSTRACT

A memory system, which is connected to a host device, includes a memory, a host interface which receives a command and an address, which are output from the host device, and a controller which operates in one of a first mode in which the controller converts the address which is received by the host interface and accesses the memory by using the converted address, and a second mode in which the host device directly accesses the memory by using the address which is received by the host interface, the controller controlling switching between the first mode and second mode in accordance with the command.

10 Claims, 16 Drawing Sheets

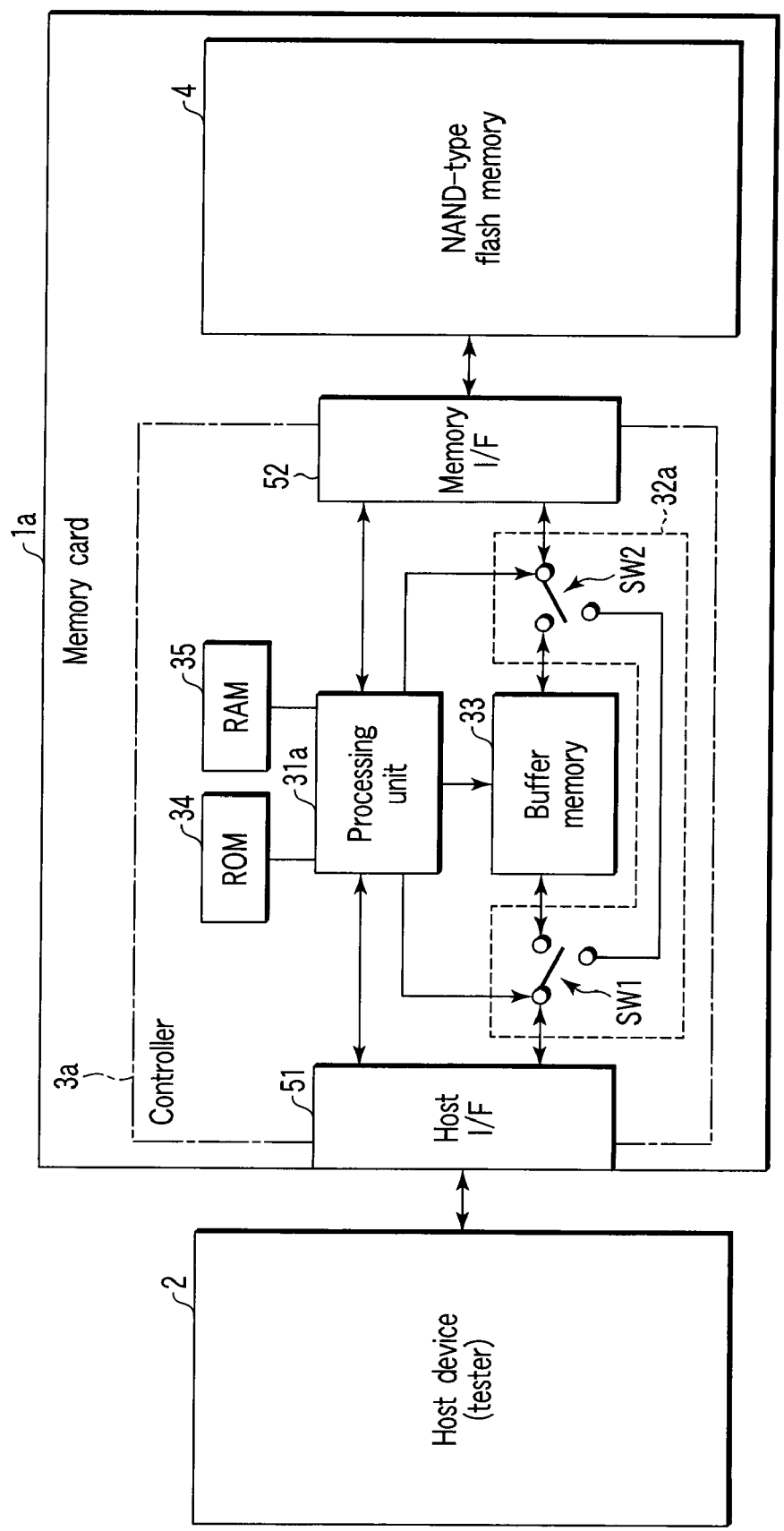
F I G. 1

| Pin NO. | Signal | | |
|---|---|---|---|
| | Pin name | Type | Function |
| P1 | GND | (O) | GND |
| P2 | R/-B | O (OD) | Ready/Busy |
| P3 | -RE | I | Read enable |
| P4 | -CE | I | Card enable |
| P5 | CLE | I | Command latch enable |
| P6 | ALE | I | Address latch enable |
| P7 | -WE | I | Write enable |
| P8 | -WP | I | Write protect |
| P9 | GND | | GND |
| P10 | D0 | I/O | Data 0 |
| P11 | D1 | I/O | Data 1 |
| P12 | D2 | I/O | Data 2 |
| P13 | D3 | I/O | Data 3 |
| P14 | D4 | I/O | Data 4 |
| P15 | D5 | I/O | Data 5 |
| P16 | D6 | I/O | Data 6 |
| P17 | D7 | I/O | Data 7 |
| P18 | Vcc | S | Vcc |

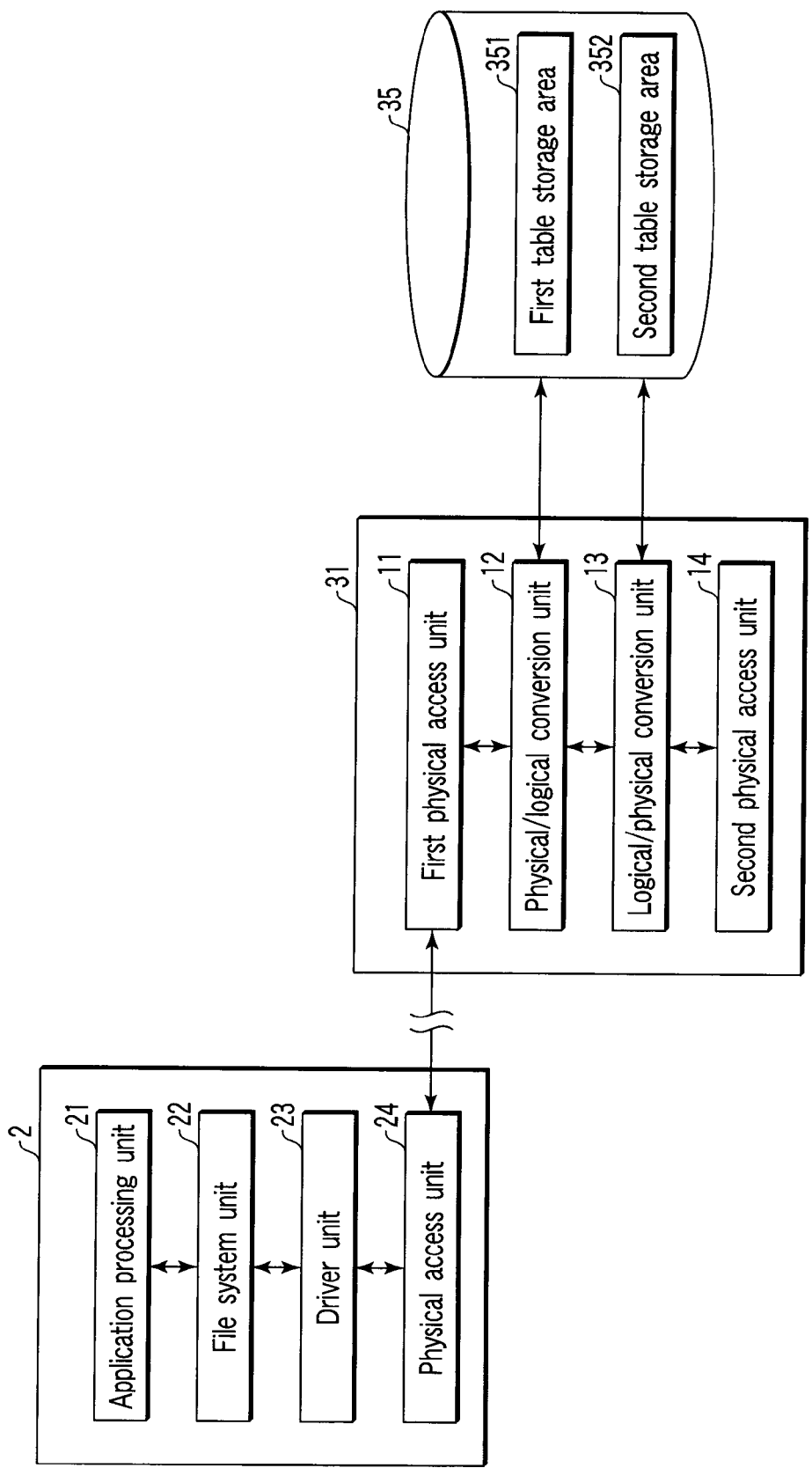
F I G. 5

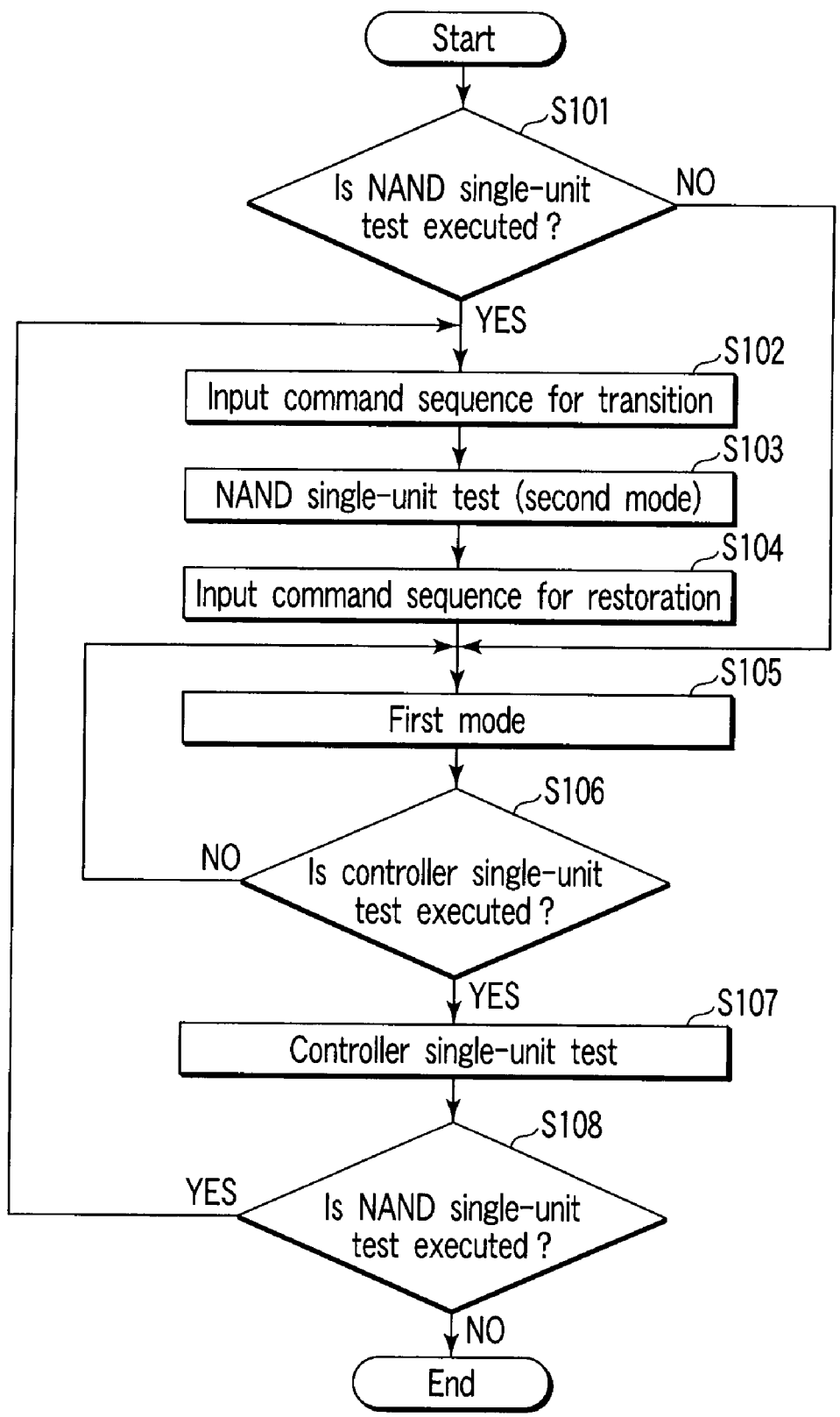
F I G. 11

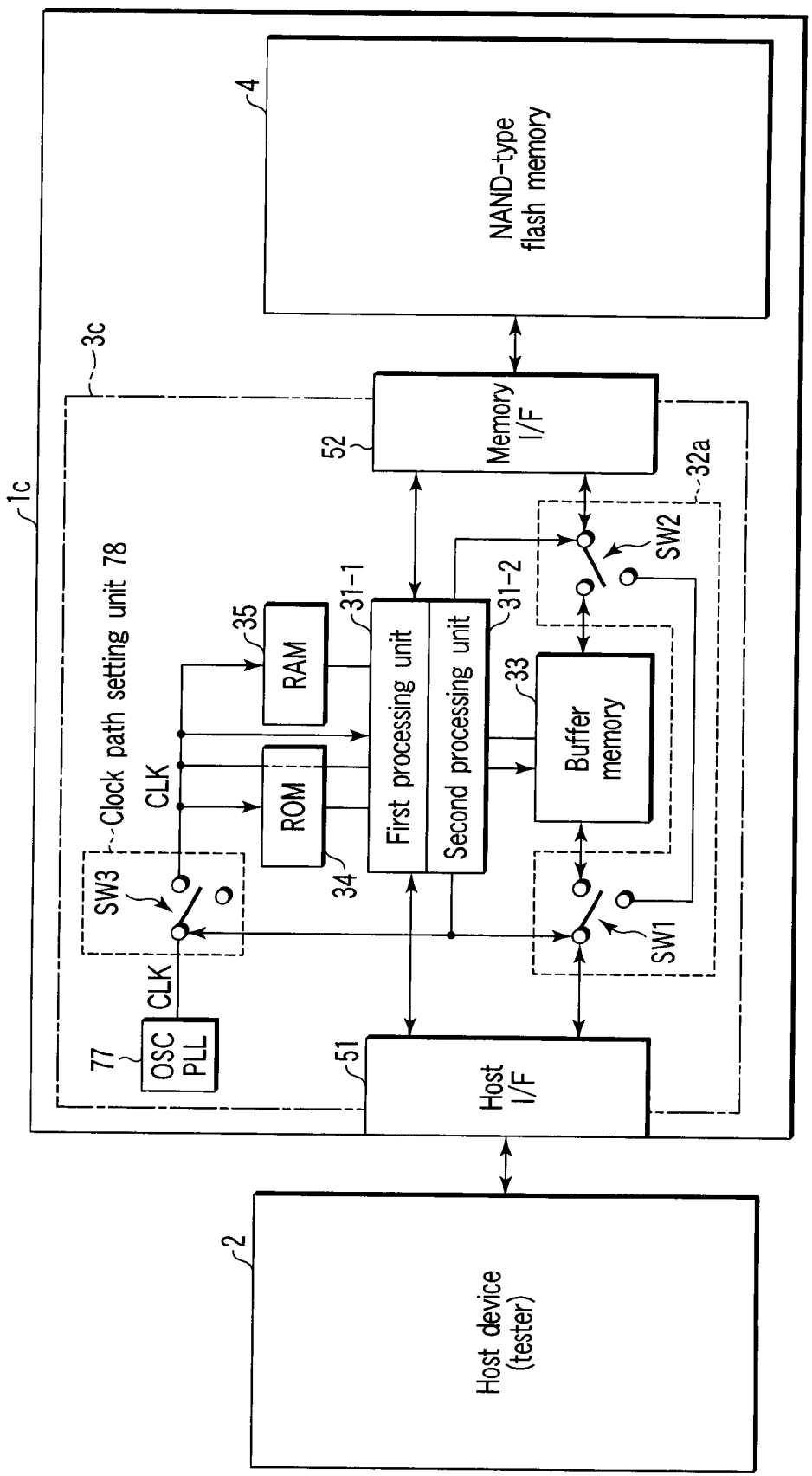
F I G. 14

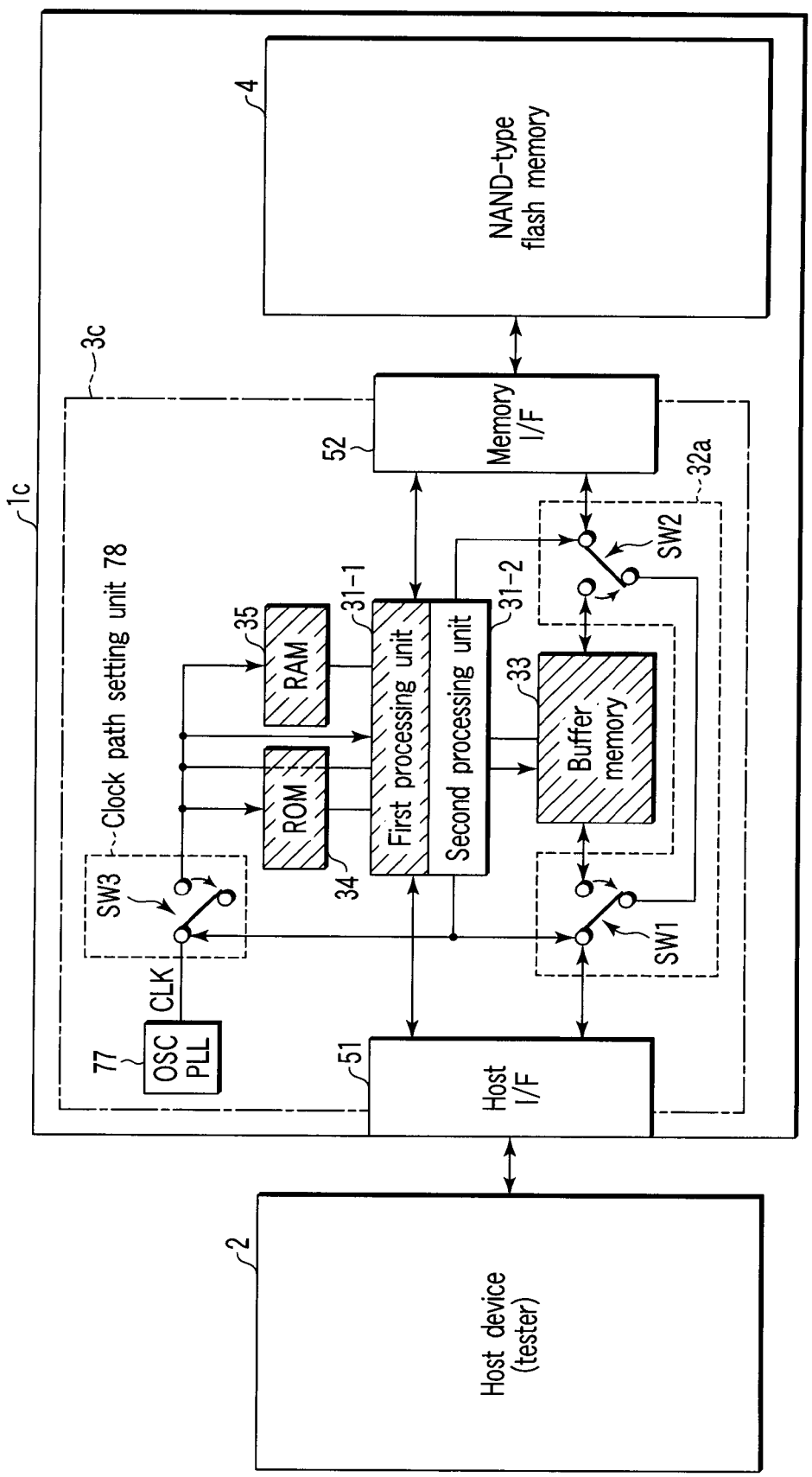
F I G. 16

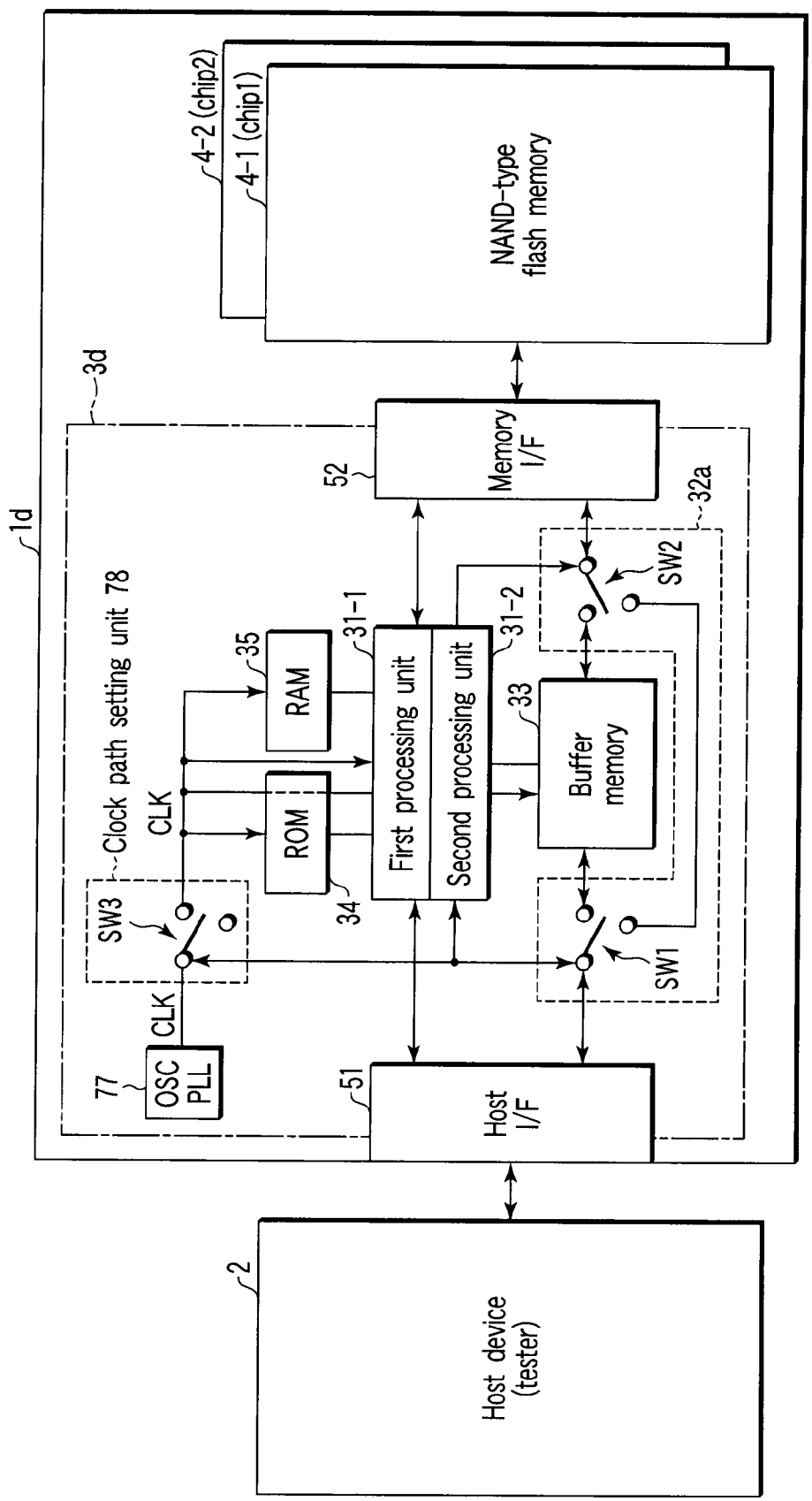
F I G. 17

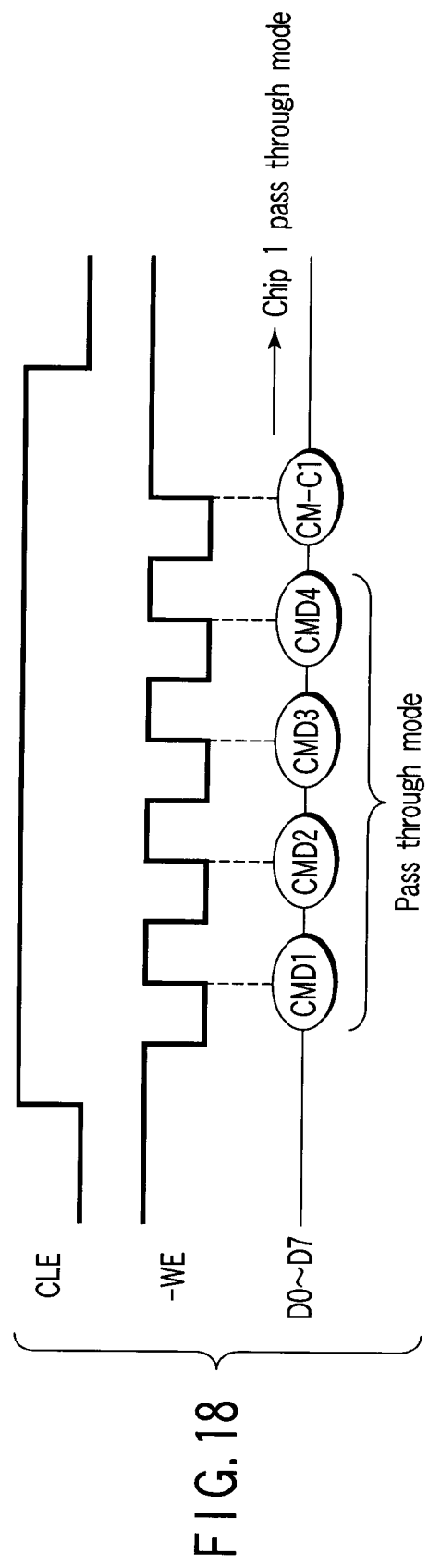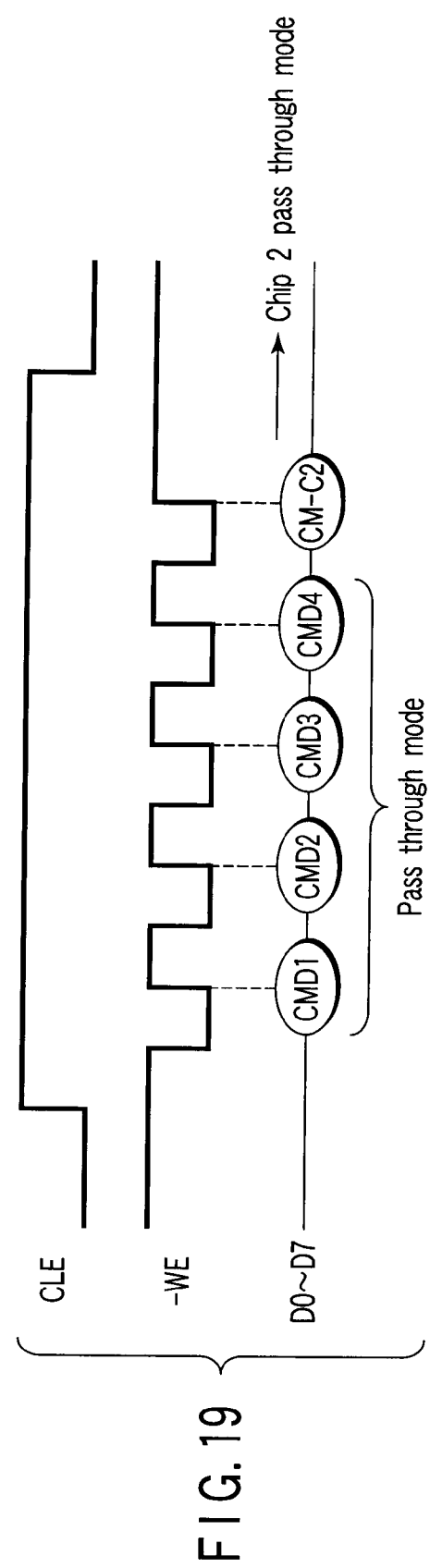
F I G. 18
F I G. 19

MEMORY SYSTEM AND CONTROLLER

CROSS-REFERENCE TO RELATED APPLICATIONS

This application is based upon and claims the benefit of priority from prior Japanese Patent Application No. 2006-098377, filed Mar. 31, 2006, the entire contents of which are incorporated herein by reference.

BACKGROUND OF THE INVENTION

1. Field of the Invention

The present invention relates to a memory system in which a nonvolatile semiconductor memory is mounted, and to a controller.

2. Description of the Related Art

In recent years, a memory system such as a memory card, which is one of removable memory devices, has widely been used in various types of portable electronic apparatuses such as a personal computer (PC), a PDA, a camera and a mobile phone. There is known a memory card in which a controller is not mounted and only a NAND-type flash memory is mounted. In this NAND-type flash memory, an erase block size is normally small and is set at, e.g., 16 Kbytes.

At present, a NAND-type flash memory, which is inexpensive and has a large capacity and a large erase block size, has begun to be used as a NAND-type flash memory which is mounted in a memory card. In this NAND-type flash memory, a controller is mounted and the erase block size is set at, e.g., 256 Kbytes.

In a shipment test of the memory card including the controller, it is necessary to individually test the controller and the nonvolatile semiconductor memory. There is known a pass-through mode in which the nonvolatile semiconductor memory is directly accessed without intervention of the controller, thereby to independently test the nonvolatile semiconductor memory. In order to realize the pass-through mode, a method has been proposed wherein a first operation mode and the pass-through mode are switched in accordance with a mode signal which is input from a mode terminal that is an external connection pin (see, e.g., Jpn. Pat. Appln. KOKAI Publication No. 2004-158098).

In the above method in which the mode terminal is provided, however, the increase in number of external connection pins leads to an increase in size of the whole memory card and an increase in fabrication cost of the memory card. Moreover, the structure of a host device (tester), which tests the memory card, needs to be modified so as to adapt to the increase in number of external connection pins.

BRIEF SUMMARY OF THE INVENTION

According to an aspect of the present invention, there is provided a memory system which is connected, when used, to a host device, comprising: a nonvolatile semiconductor memory; a host interface which receives a command and an address, which are output from the host device; and a controller which operates in one of a first mode in which the controller converts the address which is received by the host interface and accesses the nonvolatile semiconductor memory by using the converted address, and a second mode in which the host device directly accesses the nonvolatile semiconductor memory by using the address which is received by the host interface, the controller controlling switching between the first mode and second mode in accordance with the command.

According to another aspect of the present invention, there is provided a controller mounted in a memory system which is connected, when used, to a host device, comprising: a host interface which receives a command and an address, which are output from the host device; and a processing unit which operates in one of a first mode in which the processing unit converts the address which is received by the host interface and accesses a nonvolatile semiconductor memory by using the converted address, and a second mode in which the host device directly accesses the nonvolatile semiconductor memory by using the address which is received by the host interface, the processing unit controlling switching between the first mode and second mode in accordance with the command.

According to still another aspect of the present invention, there is provided a memory system which is connected, when used, to a host device, comprising: a nonvolatile semiconductor memory; a host interface which receives a command and an address, which are output from the host device; and a controller comprising a first processing unit which executes an overall control of the memory system and stops operating at a time of a pass-through mode, and a second processing unit which is capable of interpreting a command for transition to the pass-through mode and a command for restoration from the pass-through mode, and continues to operate at a time of the pass-through mode.

BRIEF DESCRIPTION OF THE SEVERAL VIEWS OF THE DRAWING

FIG. 1 is a block diagram showing an example of the structure of a memory card according to a first embodiment of the invention;

FIG. 5 is a functional block diagram showing an example of the functional structures of the host device and memory card according to the first embodiment;

FIG. 11 is a flowchart illustrating an example of a test operation in the memory card according to the first embodiment;

FIG. 14 is a block diagram showing an example of the structure of a memory card according to a third embodiment of the invention;

FIG. 16 is a block diagram for describing the memory card in a pass-through mode according to the third embodiment;

FIG. 17 is a block diagram showing an example of the structure of a memory card according to a fourth embodiment of the invention;

FIG. 18 shows an example of a command sequence for transition to a pass-through mode according to the fourth embodiment;

FIG. 19 shows an example of the command sequence for transition to the pass-through mode according to the fourth embodiment;

DETAILED DESCRIPTION OF THE INVENTION

Figures 2, 3:
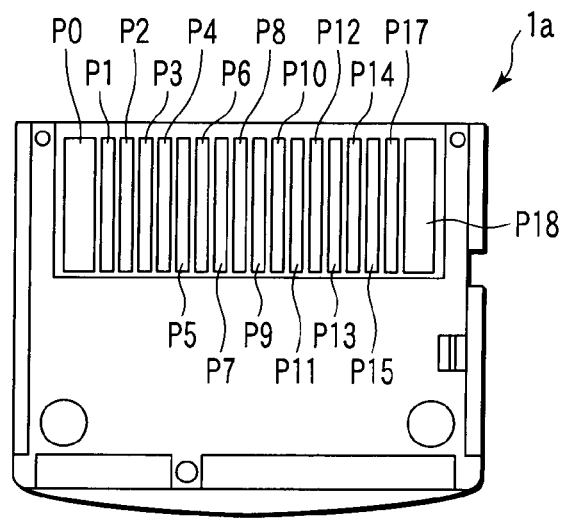
FIG. 2 is a plan view showing an example of the external appearance of the memory card according to the first embodiment and an example of arrangement of pins.
FIG. 3 shows an example of pin assignment in the memory card according to the first embodiment.

First to fourth embodiments of the present invention will now be described with reference to the accompanying drawings. In the drawings relating to the first to fourth embodiments, the same or similar parts are denoted by the same or like reference numerals. A memory card, which is detachably attached to a host device, is described as a memory system by way of example.

First Embodiment

A memory card 1a according to a first embodiment of the present invention is electrically connected to a host device 2, which functions as a tester, at the time of shipment, as shown in FIG. 1. The memory card 1a includes a controller 3a which transmits/receives data to/from the host device 2, a NAND-type flash memory 4 serving as a nonvolatile semiconductor memory, a host interface 51 which executes an interface process between the host device 2 and controller 3a, and a memory interface 52 which executes an interface process between the controller 3a and NAND-type flash memory 4. The host interface 51 receives a command and an address which are output from the host device 2. The controller 3a operates in one of a first mode in which the controller 3a converts the address which is received by the host interface 51 and accesses the NAND-type flash memory 4 by using the converted address, and a second mode in which the host device 2 directly accesses the NAND-type flash memory 4 by using the address which is received by the host interface 51. The controller 3a controls the switching between the first mode and second mode in accordance with a switching command.

In the description below, the switching operation from the first mode to second mode is referred to as a "transition operation", and the switching operation from the second mode to the first mode is referred to as a "restoration operation". The "first mode" is an operation mode in which the host device 2 does not directly access the NAND-type flash memory 4, and means an operation mode similar to an operation at a time of actual use.

At the time of a shipment test, the host device 2 individually tests the controller 3a and NAND-type flash memory 4. In the description below, a test, which is conducted on the controller 3a alone, is referred to as a "controller single-unit test", and a test, which is conducted on the NAND-type flash memory 4 alone, is referred to as a "NAND single-unit test". At the time of the controller single-unit test, the operation mode is set to the first mode. On the other hand, at the time of the NAND single-unit test, the operation mode is set to the second mode.

The NAND-type flash memory 4 has a memory capacity of, e.g., 1 Gbit or more, and the size of an erase block, which is an erase unit, is set at 256 Kbytes. In the NAND-type flash memory 4, data write/read is executed in units of 16 Kbytes. In the case where the memory capacity of the NAND-type flash memory 4 is 1 Gbit, the number of erase blocks is 512. The NAND-type flash memory 4 is fabricated by using, e.g., 0.09 μm process technology, and the design rule is less than 0.1 μm.

The controller 3a includes a processing unit 31a, an access path setting unit 32a, a buffer memory 33, a ROM 34 and a RAM 35. The ROM 34 stores, e.g., a control program (firmware) which is executed by the processing unit 31a. The processing unit 31a executes the control program, which is stored in the ROM 34, thereby executing various processes. The RAM 35 is used as a working area of the processing unit 31a and temporarily stores the control program and various tables.

In the first mode, the processing unit 31a loads the control program, which is stored in the ROM 34, into the RAM 35, and executes a predetermined process. As a result, the process unit 31a, for example, creates various tables on the RAM 35, accesses the NAND-type flash memory 4 by receiving a write command, a read command, an erase command, etc., from the host device 2, and controls a data transfer process via the buffer memory 33.

In the first mode, when data that is sent from the host device 2 is to be written in the NAND-type flash memory 4, the buffer memory 33 temporarily stores a predetermined amount of data (e.g., 1-page data). In addition, when data that is read from the NAND-type flash memory 4 is to be sent to the host device 2, the buffer memory 33 temporarily stores a predetermined amount of data.

In the second mode, the access path setting unit 32a sets an access path, through which the host device 2 directly accesses the NAND-type flash memory 4. For example, the access path setting unit 32a includes a first switch SW1 which is connected between the buffer memory 33 and the host interface 51, and a second switch SW2 which is connected between the buffer memory 33 and the memory interface 52. The first and second switches SW1 and SW2 change the connections between the host interface 51, buffer memory 33 and memory interface 52 in accordance with switch control signals from the processing unit 31a. As a result, in the second mode, write data and read data, for instance, detour around the buffer 33, and a command, for instance, which is issued by the host device 2, can directly be transmitted to the NAND-type flash memory 4.

As has been described above, since this embodiment has the structure in which the transition operation and restoration operation are controlled in accordance with the command, the second mode can be realized without increasing the number of external connection pins.

FIG. 2 shows an example of arrangement of external connection pins of the memory card 1a. FIG. 2 shows the memory card 1a, as viewed from the pin formation surface thereof. The memory card 1a has 18 external connection pins, that is, first to 18th pins P1 to P18. FIG. 3 shows the first to 18th pins P1 to P18 and examples of signals which are assigned to these pins. In the "TYPE" attribute in FIG. 3, "S" indicates the power supply voltage, "I" indicates an input to the memory card 1a, "O" indicates an output from the memory card 1a, and "I/O" indicates memory card 1a input/output. The "−" symbol, when added to a pin name (signal name), indicates a low-true signal, that is, a signal which is asserted when low.

The first and ninth pins P1 and P9 are assigned to a ground voltage GND, and the 18th pin P18 is assigned to a power supply voltage Vcc.

The second pin P2 is assigned to a ready/busy (R/−B) signal for informing the host device 2 of an internal operation state of the memory card 1a. While an internal operation, such as write, read or erase, is being executed, a busy signal is output from the second pin P2, and a ready signal is output if the operation is completed.

The third pin P3 is assigned to a read enable (−RE) signal for outputting data, and the fourth pin P4 is assigned to a card enable (−CE) signal for setting the memory card 1a in an operable state.

The fifth pin P5 is assigned to a command latch enable (CLE) signal for controlling taking-in of a command, and the sixth pin P6 is assigned to an address latch enable (ALE) signal for controlling taking-in of an address.

The seventh pin P7 is assigned to a write enable signal (−WE) signal for writing data to the memory card 1a, and the eighth pin P8 is assigned to a write protect (−WP) signal for forcibly prohibiting write and erase.

The 10th to 17th pins P10 to P17 are assigned to bits D0 to D7 of a command, an address and data.

On the other hand, the NAND-type flash memory 4 and memory interface 52 have the same pin structure as the pin structure of the pins of the host interface 51 shown in FIG. 3. Specifically, each of the NAND-type flash memory 4 and memory interface 52 has input/output (I/O) pins 1 to 8 to/from which a command, an address and data are input/output, an R/−B pin for outputting a ready/busy signal, a −RE pin to which a read enable signal is input, a −CE pin to which a chip enable signal is input, a CLE pin to which a command latch enable signal is input, an ALE pin to which an address latch enable signal is input, a −WE pin to which a write enable signal is input, and a −WP pin to which a write protect signal is input.

As has been described above, the memory card 1a has a pin structure corresponding to the pin structure of the NAND-type flash memory 4, and the host device 2 can access the memory card 1 by a command sequence to the NAND-type flash memory 4. A "command sequence", in this context, refers to a combination of one command and an address, etc., a combination of a plurality of commands, or a combination of any one or more or all of at least one command, at least one address and at least one data.

The controller 3a controls the transition operation and restoration operation in accordance with a command, as described above. However, in the case of controlling the transition operation and restoration operation in accordance with a command, there is a concern that the controller 3a may erroneously operate by erroneously recognizing a write time or a read time. In addition, if the same address or data as a command (e.g., "FFh" command [h: hexadecimal number]) designating the restoration operation is input, the controller 3a would execute an unintended restoration operation.

By controlling the transition operation or restoration operation by a command sequence, the erroneous operation of the controller 3a can be avoided. Specifically, when the NAND single-unit test is to be executed, the host device 2 issues a command sequence which instructs the transition operation, after the memory card 1a is powered on. In the case where the operation mode is set to the second mode by the command sequence which instructs the transition operation, the controller 3a maintains the second mode until a command sequence which instructs the restoration operation is issued. As a result, the controller 3a can avoid the problem that the controller 3a executes the unintended restoration operation in the second mode.

Furthermore, in the first mode, the host device 2 assigns logical addresses and physical addresses in units of 16 Kbytes, assuming the use of a NAND-type flash memory 4 in which the erase block size is set at 16 Kbytes. In many cases, since a sequential write access or read access is executed for the 16 Kbytes of the logical address, the corresponding command is issued. In the description below, the terms "logical block address" and "physical block address" mean the logical address and physical address of the block itself. Although the terms "logical address" and "physical address" mainly refer to the logical address and physical address of the block itself, these terms may also refer to addresses corresponding to units of a finer resolution than the block unit.

The host device 2 is configured to manage the internal physical state of the memory card 1a. For example, the host device 2 executes management as to which of numerically ordered logical sector address data is stored at which physical block address, or which block is in the erased state. Thereby, the host device 2 directly controls the NAND-type flash memory 4 in the memory card 1a.

In the case where the host device 2 operates on the assumption of the use of the NAND-type flash memory 4 in which the erase block size is set at 16 Kbytes, the memory card 1a cannot normally respond and malfunctions because the actual erase block of the NAND-type flash memory 4 is 256 Kbytes.

In order to avoid the malfunction of the memory card 1a, the controller 3a processes, in the first mode, the command sequence which is issued by the host device 2 on the assumption of an erase block size that is smaller than the erase block size of the NAND-type flash memory 4, and controls the write, read and erase operations for the NAND-type flash memory 4.

Figure 4:
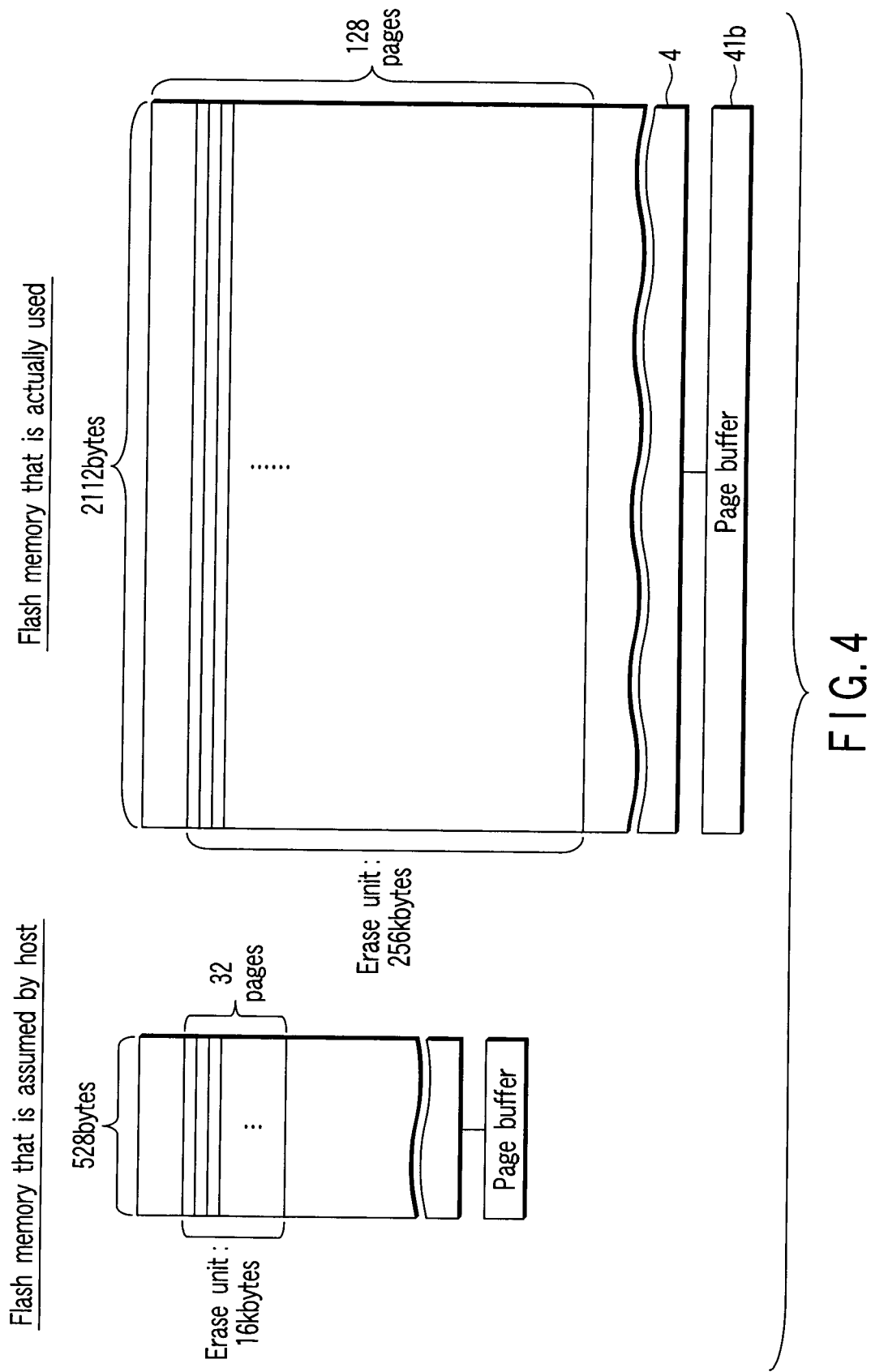
FIG. 4 is a schematic view showing a relationship in data arrangement between a NAND-type flash memory which is assumed by a host device in a first mode, and a NAND-type flash memory which is actually mounted in the memory card.

Referring to FIG. 4, a description is given of a difference in data arrangement between a NAND-type flash memory which is assumed by the host device 2 and an actually used NAND-type flash memory (i.e., NAND-type flash memory 4 in the memory card 1a).

In the NAND-type flash memory that is assumed by the host device 2, each page has a 528-byte memory capacity which is composed of a 512-byte data memory portion and a 16-byte redundant portion. 32 pages are one erase unit (i.e., 16 Kbytes+0.5 Kbyte). In the description below, for the purpose of description, a card including this NAND-type flash memory is also referred to as a "small-block card".

On the other hand, in the actually used NAND-type flash memory 4, each page has a 2112-byte memory capacity which is composed of, e.g., four 512-byte data memory portions, four 10-byte redundant portions, and a 24-byte management data memory portion. 128 pages are one erase unit (i.e., 256 Kbytes+8 Kbytes). In the description below, for the purpose of description, a card including this NAND-type flash memory 4 is also referred to as a "large-block card". For example, the erase unit of the small-block card is 16 Kbytes, and the erase unit of the large-block card is 256 Kbytes.

Each of the NAND-type flash memory that is assumed by the host device 2 and the NAND-type flash memory 4 that is actually used includes a page buffer 41a, 41b for inputting/outputting data to/from the NAND-type flash memory. The storage capacity of the page buffer 41a, which is included in the NAND-type flash memory that is assumed by the host device 2, is 528 bytes (512 bytes+16 bytes). On the other hand, the storage capacity of the page buffer 41b, which is included in the NAND-type flash memory 4 that is actually used, is 2112 bytes (2048 bytes+64 bytes). At the time of, e.g., data write, the data input/output process for the NAND-type flash memory is executed in units of one page corresponding to the storage capacity of the page buffer 41a, 41b.

As has been described above, since the NAND-type flash memory that is assumed by the host device 2 is different from the actually used NAND-type flash memory 4, the controller 3a executes various processes for enabling the host device 2 to handle the NAND-type flash memory 4.

FIG. 5 shows an example of the functional structures of the host device 2 and memory card 1a. In the host device 2, a program, which is stored in, e.g., a ROM (not shown) in the host device 2, is executed by, e.g., a CPU (not shown), thereby realizing the functions of an application processing unit 21, a file system unit 22, a driver unit 23 and a physical access unit 24, which are shown in FIG. 5.

On the other hand, in the memory card 1a, a control program, which is stored in, e.g., the ROM 34, is executed by the processing unit 31a, thereby realizing the functions of a first physical access unit 11, a physical/logical conversion unit 12, a logical/physical conversion unit 13 and a second physical access unit 14, which are shown in FIG. 5.

For example, if the application processing unit 21 of the host device 2 sends a file write request to the file system unit 22, the file system unit 22 instructs the driver unit 23 to execute sequential sector write on the basis of logical block addresses of the small-block card. Upon receiving the instruction, the driver unit 23 realizes sequential write in units of a 16-Kbyte block on the basis of the logical block addresses of the small-block card. In this case, the driver unit 23 executes logical/physical block conversion, and issues to the large-block card a random write command, which is based on the physical block address of the small-block card, through the physical access unit 24, thus executing data transfer.

In the write access, in the case of either the small-block card or large-block card, for the reason of protocols, information transmission/reception is executed in the order of (1) command, (2) page address (row address), (3) column address, (4) data and (5) program confirmation command.

If the first physical access unit 11 in the memory card 1a receives a write command, which is based on the physical block address of the small-block card, from the host device 2, the first physical access unit 11 acquires not only the physical block address and data, but also the logical block address included in the data accompanying the physical block address and data.

The physical/logical conversion unit 12 creates a first table for executing, at the time of, e.g., data read, a conversion process from the physical block address of the small-block card (corresponding to the 16-Kbyte block) to the logical block address of the small-block card (corresponding to the 16-Kbyte block). The first table is stored in a first table storage area 351 of the RAM 35. When the first physical access unit 11 receives the write command and acquires the logical block address of the small-block card, the physical/logical conversion unit 12 reflects the logical block address of the small-block card on the first table. The physical/logical conversion unit 12 also reflects the physical block address on the first table.

The logical/physical conversion unit 13 creates a second table for executing, at the time of, e.g., data read, a conversion process from the logical block address of the small-block card (corresponding to the sequential 16-Kbyte block×16) to the physical block address of the large-block card (corresponding to the 256-Kbyte physical block). The second table is stored in a second table storage area 352 of the RAM 35. When the first physical access unit 11 receives the write command and acquires the logical block address of the small-block card, the physical/logical conversion unit 12 reflects the logical block address of the small-block card on the second table.

The second physical access unit 14 determines the data arrangement in the NAND-type flash memory 4 on the basis of the logical block address of the small-block card, which the first physical access unit 11 has acquired upon receiving the write command. The second physical access unit 14 then sequentially writes the 16-Kbyte data in units of 2 Kbytes (1 page) in the 256-Kbyte physical block. In addition, the second physical access unit 14 stores the acquired logical block address and physical block address of the small-block card in a predetermined area in the management data area in the NAND-type flash memory 4.

As has been described above, the host device 2 issues the command based on the physical block address of the small-block card. Thus, the memory card 1a side executes such management as to understand which of the 256-Kbyte physical blocks includes the data corresponding to the physical block address of the small-block card. Specifically, the host device 2 manages the correspondency of the logical/physical block addresses of the small-block card for each 16-Kbyte block, and executes such management as to understand which of 256-Kbyte physical blocks in the NAND-type flash memory 4 of the memory card 1a stores the data corresponding to the logical block addresses of consecutive 256-Kbyte blocks in the small-block card.

Figure 6A:
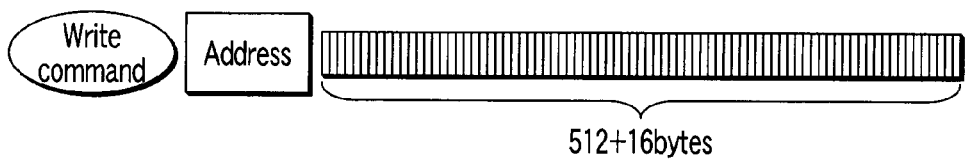
FIG. 6A is a schematic diagram showing an example of the format of a command which is input to the memory card according to the first embodiment.
Figure 6B:
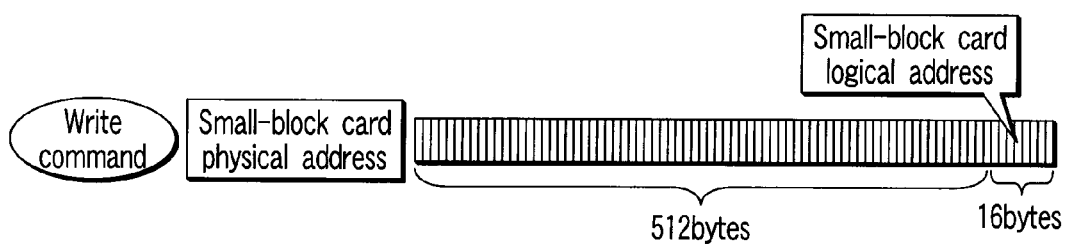
FIG. 6B is a schematic diagram showing an example of the format of the command which is input to the memory card according to the first embodiment.

Next, referring to FIG. 6A and FIG. 6B, a description is given of an example of the format of a command which is sent from the host device 2 to the memory card 1a. As shown in FIG. 6A, the packet of the command, which is sent from the host device 2, includes various information such as kind-of-command information (e.g., write command), an address (physical block address) and data (substantial data such as content and accompanying data [512 bytes+16 bytes]).

In the packet with this format, as shown in FIG. 6B, the logical block address of the small-block card (the logical address corresponding to the 16-Kbyte block to be accessed) is disposed at a predetermined position in the 16 bytes of the accompanying data. The memory card 1a acquires this logical block address, in addition to the kind-of-command information, physical block address and data. The logical block address is not added in the case of the read command.

Figures 7A, 7B:
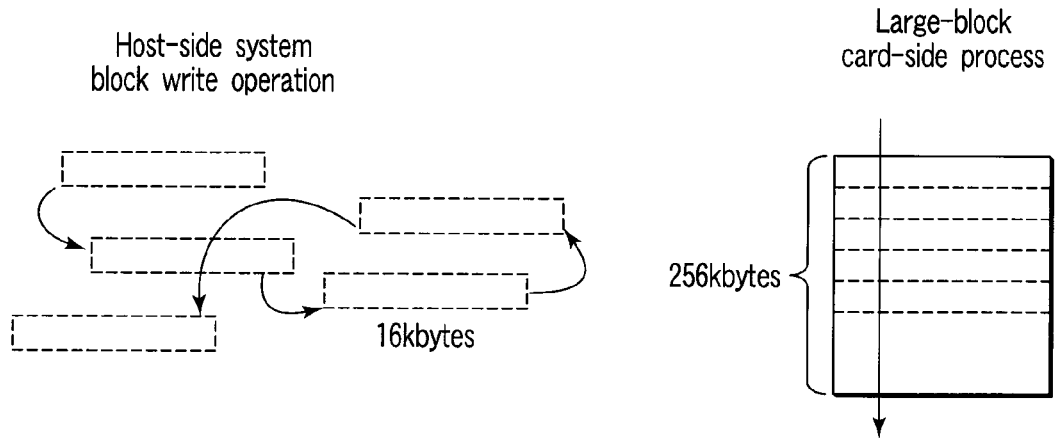
FIG. 7A is a schematic view illustrating a block write operation which is assumed by the host side in the first mode.
FIG. 7B is a schematic view illustrating a block write operation in the memory card according to the first embodiment.

Referring now to FIG. 7A and FIG. 7B, a block write operation, which is assumed by the host device 2 side, and a write process, which is actually executed by the memory card 1a, both operations being executed in the first mode, are compared and described.

As shown in FIG. 7A, at the time of occurrence of a sequential write operation of the 16-Kbyte block unit on the basis of the logical address of the small-block card, the host device 2 executes a random write operation of the 16-Kbyte block unit on the basis of the physical block address of the small-block card.

On the other hand, as shown in FIG. 7B, upon receiving the write command from the host device 2 side, the memory card 1a sequentially writes to the NAND-type flash memory 4 the data of the 16-Kbyte block unit on the basis of the logical address of the small-block card.

As described above, the host device 2 executes the random write operation of the 16-Kbyte unit on the basis of the physical address of the small block. In general, in the random write operation, a process of rewriting only a part of the large block (256 Kbytes) frequently occurs. The NAND-type flash memory 4 can execute an erase operation only on a block-by-block basis. Thus, when only a part of the block is to be rewritten, new data for rewrite is first written in a new block which has been erased. Then, non-rewritten data in the old block including old data to be rewritten is copied to the new block.

In this manner, the process of rewriting only a part of the block involves an operation of copying data which is not to be rewritten ("involved data copy"). Hence, if the process of rewriting only a part of the block frequently occurs, an overhead will considerably increase. To cope with this problem, in the first embodiment, physical addresses are re-assigned on the memory card 1a side in accordance with the order of logical addresses which are obtained from the host device 2 side. Thereby, the frequency of occurrence of the process of rewriting only a part of the block is decreased, and an increase in overhead is suppressed.

Figure 8:
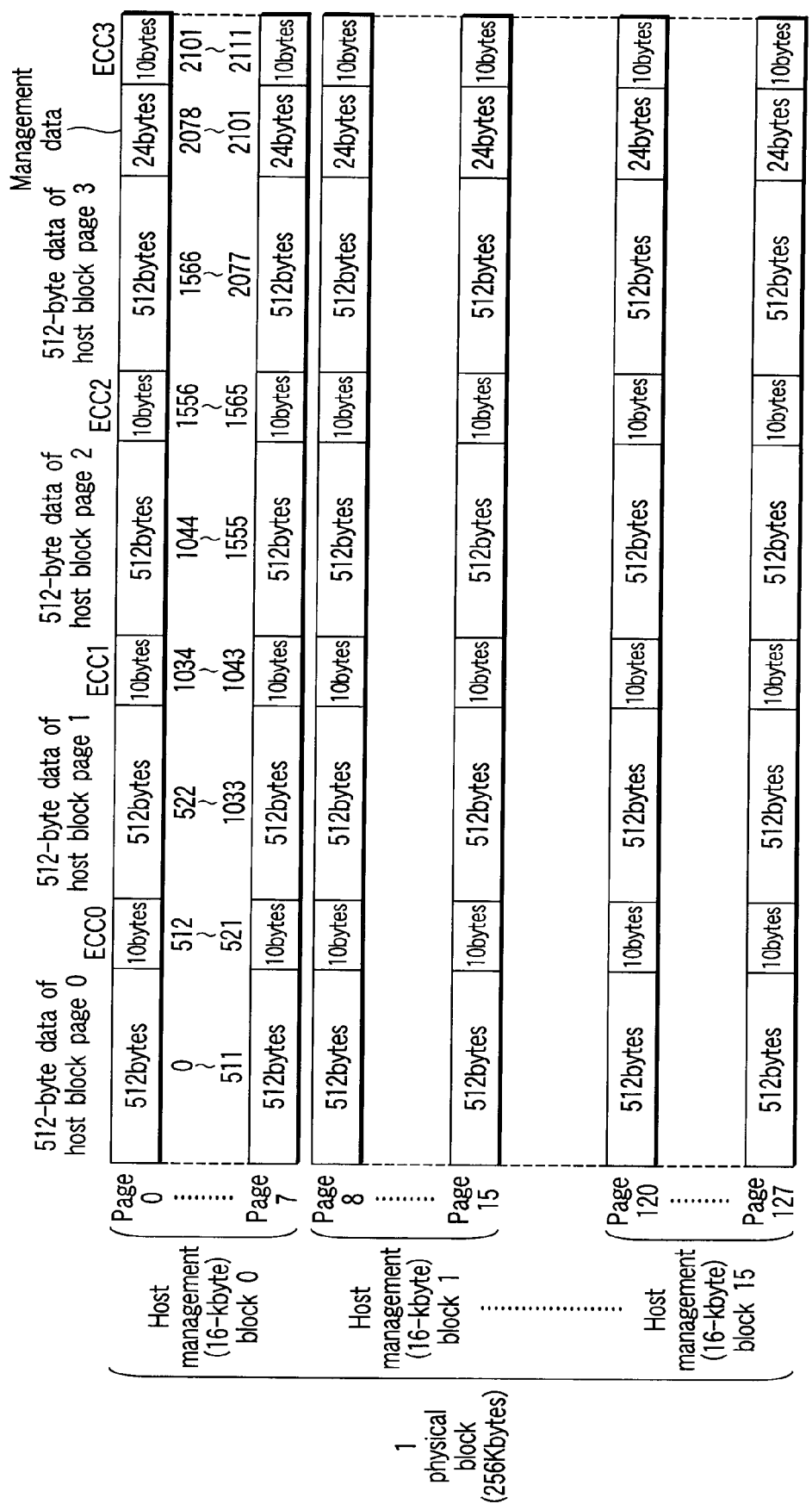
FIG. 8 is a schematic diagram showing an example of the block format of the memory card according to the first embodiment.

Next, referring to FIG. 8, the block format (256-Kbyte physical block that is the ease unit) of the NAND-type flash memory 4 is explained.

In the NAND-type flash memory 4, the 256-Kbyte physical block, which is the ease unit, includes 16 blocks ("host management blocks") each of which is used in order to write data corresponding to 16 Kbytes which is the unit that is managed by the host device 2 side. At the time of data write, individual data are arranged in the order of logical block addresses in the small-block card.

Each host management block is composed of 8 pages. Each page includes four 512-byte data areas, and 10-byte error correction code (ECC) areas corresponding to the respective data areas. In addition, a 24-byte management data area is provided after the last 512-byte data area (the fourth 512-byte data area) in the page. Thus, the last 10-byte ECC area in the page is configured to be associated with both the fourth 512-byte data area and the 24-byte management data area.

Of the 128 24-byte management data areas which are included in the 256-Kbyte physical block that is the erase unit, the last 24-byte management data area, for instance, is configured to store both the address information corresponding to the physical block addresses and the address information corresponding to the logical block addresses, which are acquired from the command that is sent from the host device 2 side. The address information is used when the above-described first and second tables are to be created.

Figure 9:
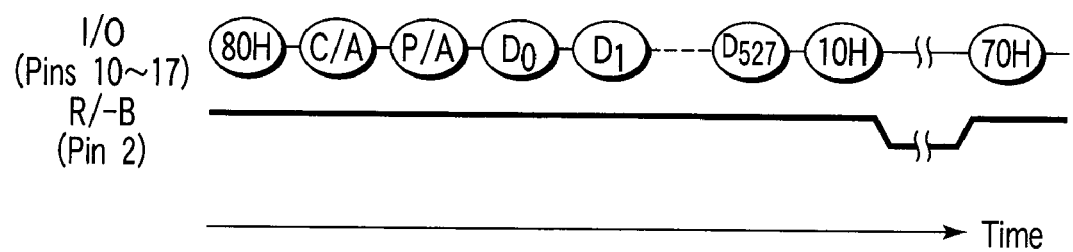
FIG. 9 is a timing chart showing an example of signals which are output from the host device when the host device executes data write to the memory card according to the first embodiment in the first mode.

Next, referring to FIG. 9, a description is given of examples of signals which are input/output to/from the input/output (I/O) pins (10th to 17th pins P10 to P17) and the ready/busy (R/–B) pin (second pin P2) of the memory card 1a when the host device 2 executes data write to the memory card 1a in the first mode.

The host device 2 controls the memory card 1a on the assumption that the memory card 1a is a nonvolatile memory having an erase block size of 16 Kbytes. Thus, at the time of data write to the memory card 1a, the host device 2 inputs a serial data input command "80H" to the I/O pins (10th pin P10 to 17th pin P17). Subsequently, the host device 2 inputs a column address "C/A" and a page address "P/A" to the I/O pins. The column address "C/A" and page address "P/A" are a column address and a page address in a virtual physical address space which are assumed in the memory card 1a by the host device 2.

Further, the host device 2 inputs write data to each of the I/O pins (10th pin P10 to 17th pin P17) 528 times. Specifically, while clocking the input signal to the write enable pin 528 times, the host device 2 successively inputs (shift-in) data of 528 bits (528 bytes in total for all I/O pins) to each I/O pin. When the shift-in of the data is completed, the host device 2 inputs a program command "10H" to the I/O pins. In response to the command, the memory card 1a outputs a low signal to the R/–B pin to indicate that the memory card 1a is in the busy state. Then, after a predetermined time period, the memory card 1a outputs a high signal to the R/–B pin, thus indicating that the memory card 1a has transitioned to the ready state.

However, the state of the R/–B pin in FIG. 9 only indicates the current state of the memory card 1a to the host device 2. Specifically, in FIG. 9, even if the R/–B pin indicates the busy state (i.e., the output is low) in response to the input of the program command "10H", this does not always mean that a write operation to the NAND-type flash memory 4 (i.e., data transfer from the page buffer to the memory cell array) is actually being performed in the memory card 1a. IN addition, even if the R/–B pin restores to the ready state, the write operation to the NAND-type flash memory 4 is not always completed in the memory card 1a.

Figure 10:
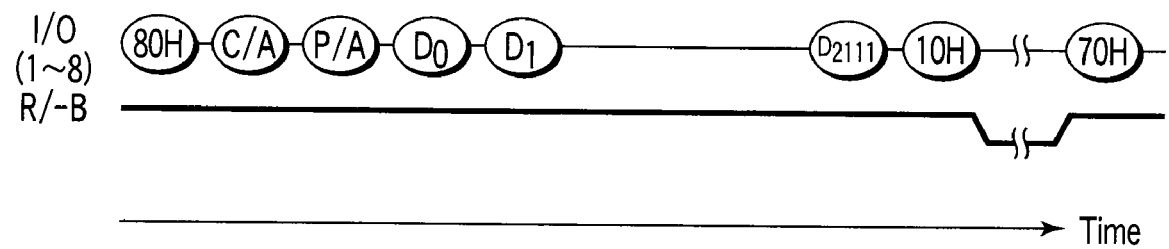
FIG. 10 is a timing chart showing an example of signals which are output from the host device when the host device executes data write to the memory card according to the first embodiment.

FIG. 10 shows examples of signals which are input/output to/from the input/output (I/O) pins 1 to 8 and R/–B pin of the NAND-type flash memory 4 when the controller 3a in the memory card 1a performs data write to the NAND-type flash memory 4 in the memory card 1a.

The controller 3a recognizes the NAND-type flash memory 4 as a nonvolatile memory having an erase block size of 256 Kbytes. For example, when data write is executed to the NAND-type flash memory 4, the controller 3a inputs a serial data input command "80H" to the I/O pins 1 to 8. Subsequently, the controller 3a inputs a column address "C/A" and a page address "P/A" to the I/O pins 1 to 8. The column address "C/A" and page address "P/A" are a column address and a page address in a real physical address space in the NAND-type flash memory 4. Thus, these addresses do not always correspond to the column address "C/A" and page address "P/A" shown in FIG. 9.

Further, the controller 3a inputs write data 2112 times to each of the I/O pins 1 to 8. Specifically, while clocking the input signal to the write enable pin 2112 times, the controller 4 successively inputs (shift-in) data of 2112 bits (2112 bytes in total for all the I/O pins). When the shift-in of the data is completed, the controller 3a inputs a program command "10H" to the I/O pins 1 to 8. In response to the command, the memory cad 1a outputs a low signal to the R/–B pin to indicate that the memory card 1a is in the busy state. Then, after a predetermined time period, the memory card 1a outputs a high signal to the R/–B pin, thus indicating that the memory card 1a has transitioned to the ready state. The state of the R/–B pin in FIG. 10 indicates the actual state of the NAND-type flash memory 4 to the controller 3a.

In FIG. 9 and FIG. 10, although one cycle is used for each input of the column address "C/A" and page address "P/A", two or more cycles may be used, as needed, in accordance with the capacity of the memory card 1a or the capacity of the NAND-type flash memory 4.

With reference to FIG. 9 and FIG. 10, the write operation in the first mode has been described. In the second mode, the host device 2 directly executes the write operation, as illustrated in FIG. 10, to the NAND-type flash memory 4 of the memory card 1a.

Next, referring to a flowchart of FIG. 11, a memory card test method according to the first embodiment is described.

To start with, in step S101, it is determined whether the NAND single-unit test is to be executed or not. If the NAND single-unit test is to be executed, the process advances to step S102. On the other hand, if the NAND single-unit test is not to be executed, the process goes to step S105.

In step S102, the host device 2 outputs a command sequence, e.g., "XX-YY-ZZ", which instructs the transition operation, to the memory card 1a. In response to the command sequence instructing the transition operation, the processing unit 31a sets the operation mode to the second mode. Specifically, the processing unit 31a delivers switch control signals to the first and second switches SW1 and SW2 of the access path setting unit 32a, thereby setting the access path. If the operation mode is set to the second mode, the process advances to step S103.

In step S103, the host device 2 executes the NAND single-unit test. For example, by confirming matching between write data and read data, it is determined whether a defect is present in the NAND-type flash memory 4. As a result, the presence/absence of a bit (fail bit), in which erroneous data is stored, or a block (bad block), in which neither data write nor data read is enabled, is determined. When the NAND single-unit test is completed, the process goes to step S104.

In step S104, the host device 2 outputs a command sequence, which instructs the restoration operation, to the memory card 1a. If the command sequence instructing the restoration operation is sent to the memory card 1a, the process advances to step S105.

In step S105, the processing unit 31a sets the operation mode to the first mode.

In step S106, it is determined whether the controller single-unit test is to be executed. If the controller single-unit test is to be executed, the process advances to step S107. If the controller single-unit test is not to be executed, the process returns to step S105.

In step S107, the host device 2 executes the controller single-unit test. For example, the host device 2 inputs an arbitrary command to the controller 3a, and checks whether the controller 3a normally responds or not. Upon completion of the controller single-unit test, the process goes to step S108.

In step S108, it is determined whether the NAND single-unit test is to be executed or not. If the NAND single-unit test is to be executed, the process returns to step S102. If the NAND single-unit test is not to be executed, the test operation ends.

As has been described above in detail, according to the first embodiment, since the transition operation and restoration operation are controlled by the command, the second mode can be realized without increasing the number of pins. Furthermore, by controlling the second mode by the specified command sequence, it becomes possible to prevent an erroneous operation due to erroneous recognition of a write time or a read time. Besides, since the host device 2 handles the erase block size in the second mode, which is greater than the block size in the first mode, the time needed for the single-unit test of the NAND-type flash memory 4 can be reduced.

Second Embodiment

Figure 12:
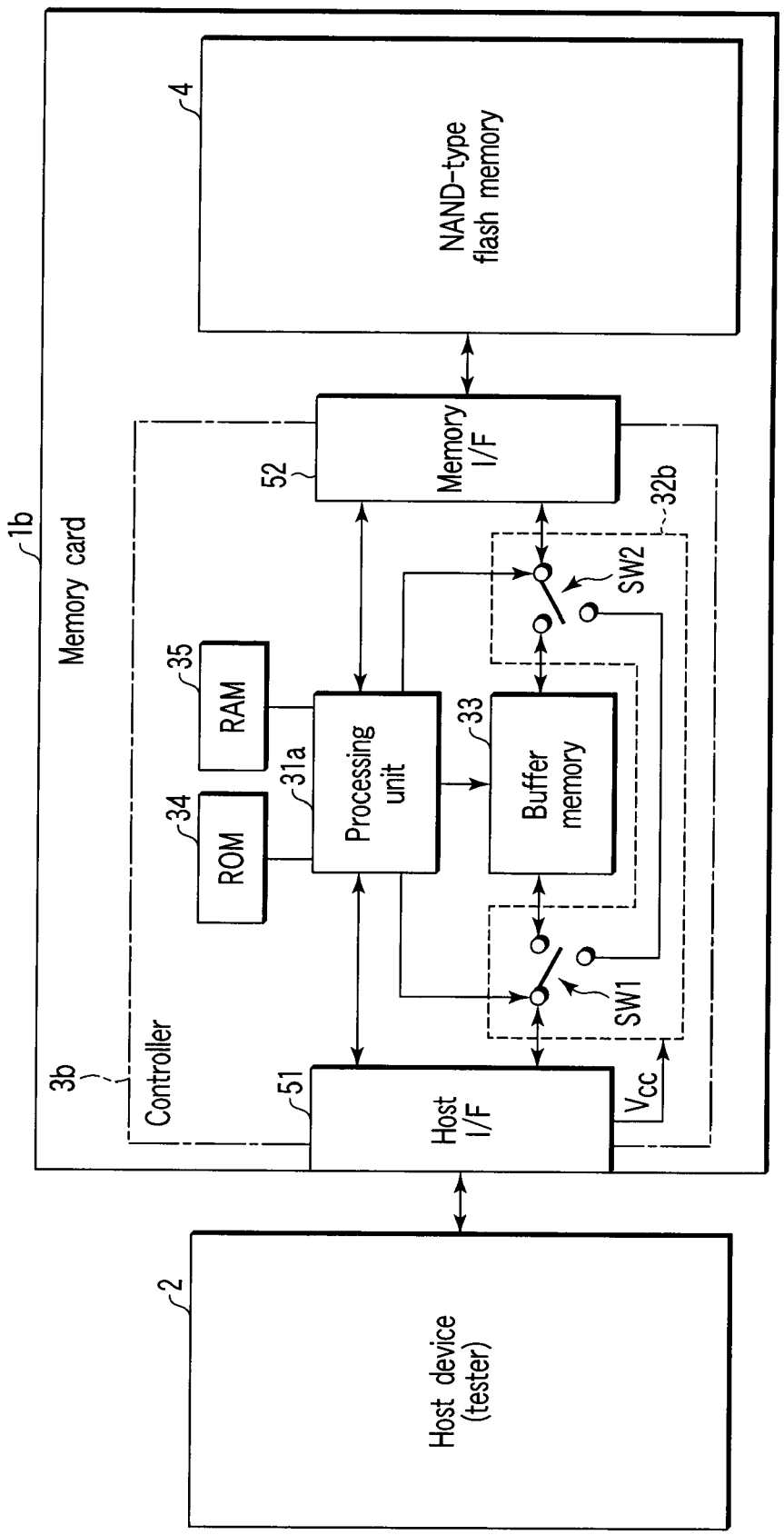
FIG. 12 is a block diagram showing an example of the structure of a memory card according to a second embodiment of the invention.

A memory card 1b according to a second embodiment of the present invention differs from the memory card 1a shown in FIG. 1 in that an access path setting unit 32b is configured, as shown in FIG. 12, to detect power-on and automatically set an access path between the host device 2 and the nonvolatile semiconductor memory. In the other structural aspects, the memory card 1b according to the second embodiment is the same as the memory card 1a shown in FIG. 1.

In the memory card 1a according to the above-described first embodiment, if a fault occurs in the operative state of, e.g., the processing unit 31a, the operation mode cannot transit to the second mode and the analysis (test) cannot further be executed. In this embodiment, when power is turned on, the second mode is automatically set and the NAND single-unit test can surely be executed.

When a ground voltage GND is applied to the first pin P1 and ninth pins P9 shown in FIG. 2 and FIG. 3 and a power supply voltage Vcc is applied to the 18th pin P18, the access path setting unit 32b sets the access path, for example, by using the rising of the power supply voltage Vcc as a trigger.

In order to restore the second mode, which is automatically set when the memory card 1b is powered on, to the first mode, it should suffice to use a command for instructing the restoration operation, e.g., "FFh" command, as well as a command sequence for instructing the restoration operation. Specifically, the controller 3b shown in FIG. 12 can execute the restoration operation upon receiving either a command or a command sequence. However, like the controller 3a shown in FIG. 1, in the case where the second mode is set by the command sequence for instructing the transition operation, the second mode cannot be restored to the first mode unless the command sequence for instructing the restoration operation is used.

Figure 13:
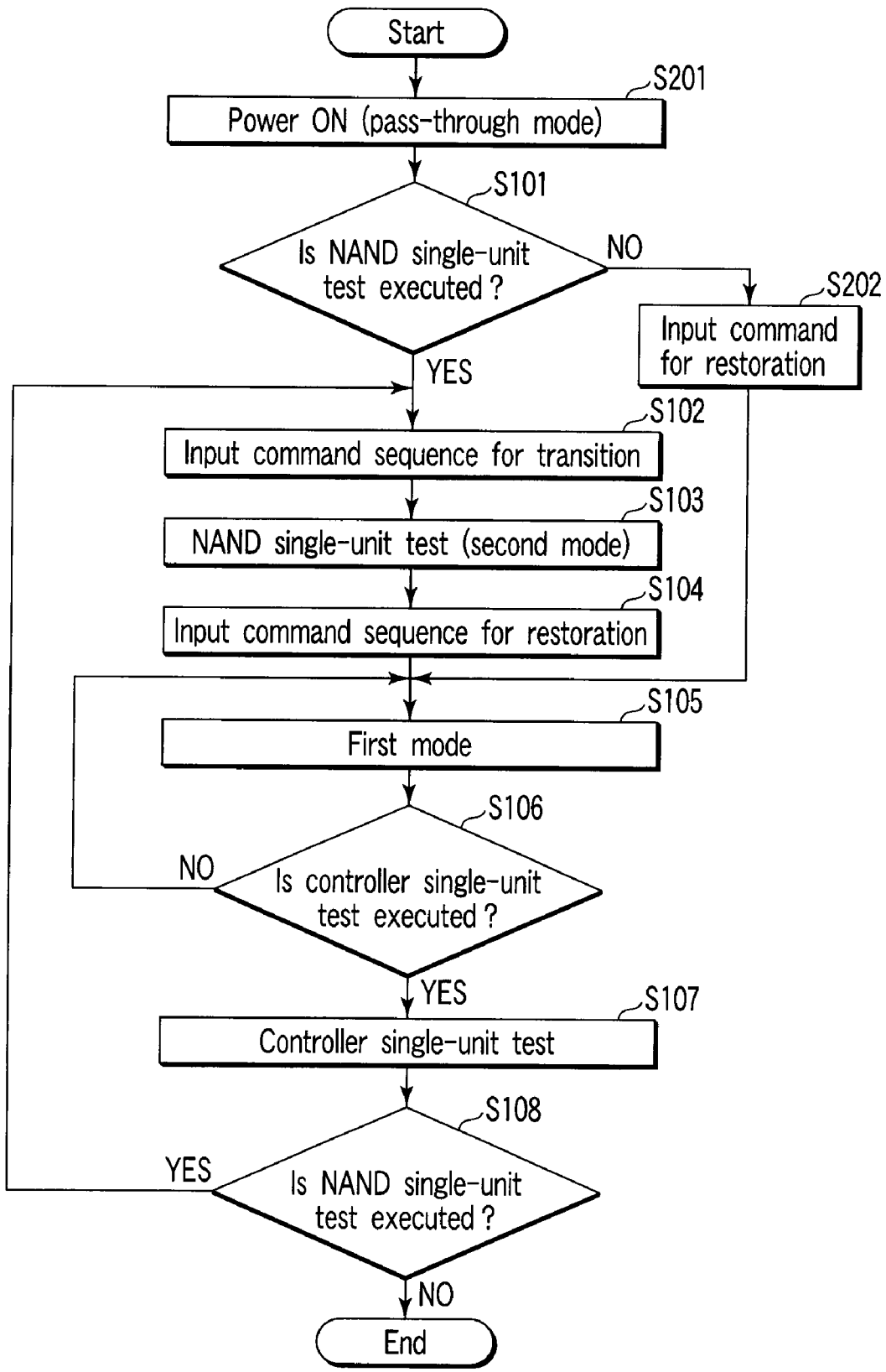
FIG. 13 is a flowchart illustrating an example of a test operation in the memory card according to the second embodiment.

Next, referring to a flowchart of FIG. 13, a memory card test method according to the second embodiment is described. It should be noted, however, that the description of the processes overlapping the memory card test method according to the first embodiment is omitted.

To start with, in step S201, the memory card 1b is inserted in a card slot (not shown) of the host device 2, and power is supplied from the host device 2 to the memory card 1b. If the memory card 1b is supplied with power, the operation mode is automatically set to the second mode.

In step S101, it is determined whether the NAND single-unit test is to be executed or not. If the NAND single-unit test is to be executed, the process advances to step S102. On the other hand, if the NAND single-unit test is not to be executed, the process goes to step S202.

In step S202, a command for instructing the restoration operation is input from the host device 2 to the memory card 1b. If the command for instructing the restoration operation is delivered from the host device 2 to the memory card 1b, the process advances to step S105.

The processes of steps S102 to S108 are similarly executed, as illustrated in FIG. 11.

According to the second embodiment, the second mode is automatically set immediately after power-on. Therefore, even if an abnormality occurs in the controller 3b, the NAND single-unit test can be executed.

Third Embodiment

FIG. 14 shows a memory card 1c according to a third embodiment of the present invention. The third embodiment relates to an example of a pass-through mode in which the operation of the controller, excluding the processing unit that serves as a command interpreting unit, is stopped at the time of the NAND single-unit test. In the description below, "pass-through mode" refers to an operation mode in which the NAND single-unit test is conducted under such a control that the operation of the controller, excluding the processing unit (second processing unit 31-2 in this embodiment) that serves as the command interpreting unit, is stopped. The description of the parts common to the first embodiment is omitted here.

As shown in FIG. 14, the memory card 1c according to this embodiment differs from the memory card of the first embodiment in that the controller 3c further includes a clock generating unit 77 and a clock path setting unit 78, and the processing unit is composed of a first processing unit 31-1 and a second processing unit 31-2.

The clock generating unit 77 is configured to generate a predetermined clock CLK along a path that is set by the clock path setting unit 78. The clock generating unit 77 is composed of, e.g., an oscillator (OSC) or a phase-locked loop (PLL) that is a circuit for outputting a signal at a frequency which is an integer number of times higher than the frequency of an input signal.

In this example, the clock path setting unit 78 is composed of a third switch SW3. The third switch SW3 changes the transmission path of the clock CLK that is generated from the clock generating unit 77, in accordance with a switch control signal which is delivered from the second processing unit 31-2. For example, a command sequence for transition is input to the third switch SW3 from the host device 2, and the third switch SW3 switches the clock path upon receiving the switching signal.

The first processing unit 31-1 is configured to control the entirety of the memory card 1c. For example, like the above-described embodiment, the first processing unit 31-1 operates in one of a first mode in which the first processing unit 31-1 converts the address which is received by the host interface 51 and accesses the NAND-type flash memory 4 by using the converted address, and a second mode in which the host device 2 directly accesses the NAND-type flash memory 4 by using the address which is received by the host interface 51. The first processing unit 31-1 controls the switching between the first mode and second mode in accordance with a switching command.

The second processing unit 31-2 is a command interpreting unit which continues to operate even in the pass-through mode (to be described below), and controls the three switches SW1, SW2 and SW3 by switch control signals. In addition, the second processing unit 31-2 is configured to be able to interpret a command for transition to the pass-through mode and a command for restoration from the pass-through mode.

<Pass-Through Mode Operation>

Figure 15:
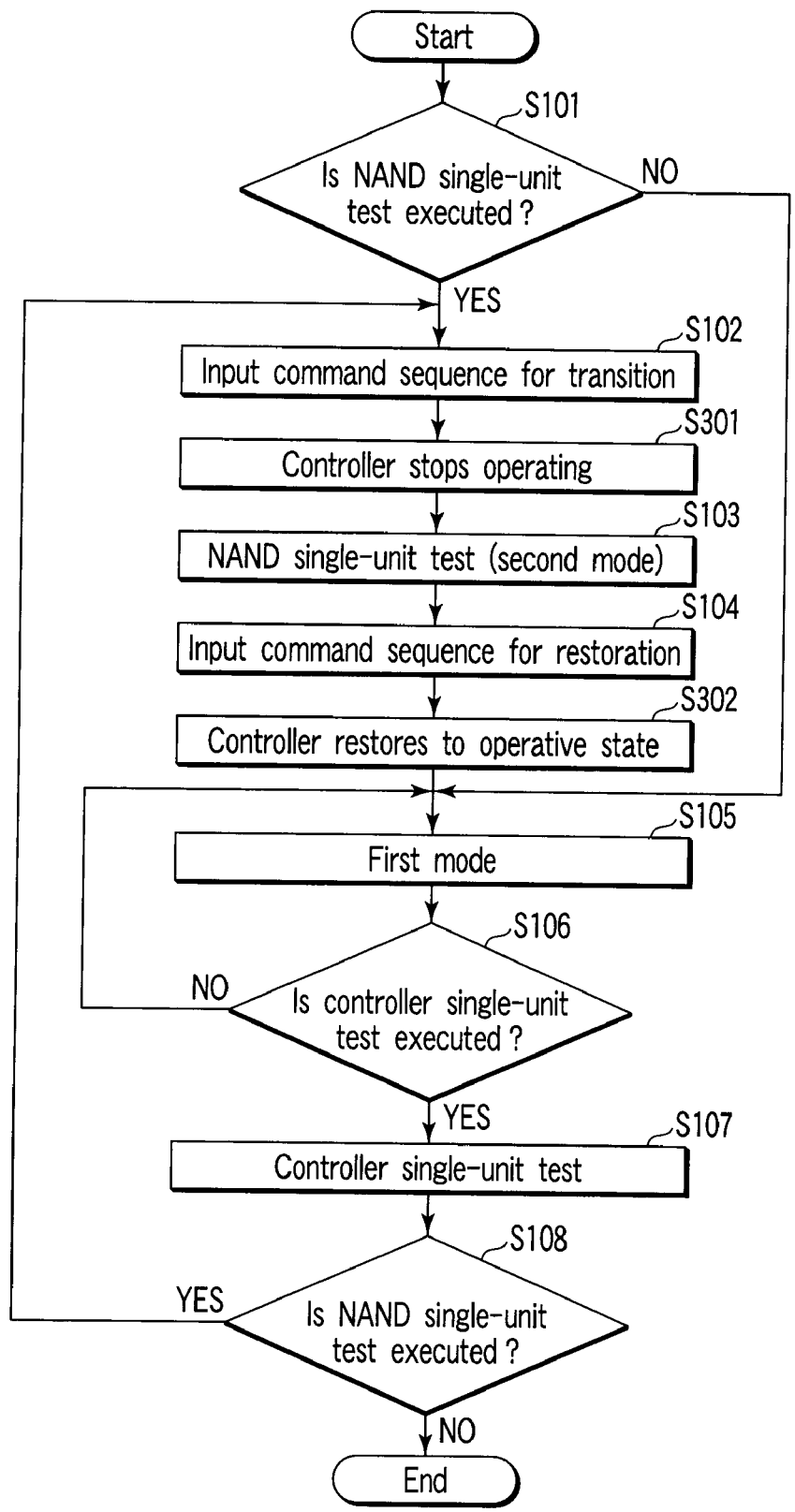
FIG. 15 is a flowchart illustrating an example of a test operation in the memory card according to the third embodiment.

Next, the pass-through mode operation of the memory card 1c according to this embodiment is described. The pass-through mode operation is described with reference to a flowchart of FIG. 15. The description of the process overlapping the memory card test method according to the first embodiment is omitted here.

In step S102, the host device 2 outputs a command sequence, which instructs the transition operation for transition to the pass-through mode, to the memory card 1c. The processing unit 31-2 interprets the command sequence which instructs the transition operation, and sets the operation mode to the pass-through mode according to the command sequence. Specifically, the processing unit 31-2 delivers switch control signals to the first and second switches SW1 and SW2 of the access path setting unit 32a and the third switch SW3 of the clock path setting unit 78, thereby setting the access path and stopping the supply of the clock CLK.

Then, in step S301, if the operation mode is set to the pass-through mode, the host device 2 executes the same NAND single-unit test as described above in the pass-through mode. At this time, as indicated by hatching lines in FIG. 16, the operation of the controller 3c, excluding the second processing unit 31-2, is stopped since the clock path setting unit 78 sets the clock path so as to stop the supply of the clock CLK.

For example, in step S301, the host device 2 confirms the matching between write data and read data and determines whether a defect is present in the NAND-type flash memory 4. Thus, the host device 2 carries out the NAND single-unit test. As a result, the presence/absence of a bit (fail bit), in which erroneous data is stored, or a block (bad block), in which neither data write nor data read is enabled, is determined in the NAND-type flash memory 4. When the NAND single-unit test is completed, the process goes to step S104.

In step S104, the host device 2 outputs a command sequence, which instructs the restoration operation, to the memory card 1c.

In step S302, if the command sequence which instructs the restoration operation is sent to the memory card 1c, the second processing unit 31-2 interprets the command sequence. Thus, in this step S302, the controller 3c is restored to the operative state.

Specifically, the second processing unit 31-2 interprets the command sequence for the restoration operation, and delivers switch control signals to the first and second switches SW1 and SW2 of the access path setting unit 32a and the third switch SW3 of the clock path setting unit 78, thereby changing the access path over to the buffer memory 33 side and resuming the supply of the clock CLK.

Subsequently, the same operation as in the above-described steps 105 to 108 is performed, and the test operation is completed.

According to the memory card 1c of this embodiment, the same advantageous effects as in the first embodiment can be obtained. In addition, the memory card 1c in this embodiment includes the processing unit 31-2 which interprets, in step S102, the command sequence which instructs the transition operation, and sets the operation mode to the pass-through mode according to the command sequence. Specifically, the processing unit 31-2 delivers switch control signals to the first and second switches SW1 and SW2 of the access path setting unit 32a and the third switch SW3 of the clock path setting unit 78, thereby setting the access path and stopping the supply of the clock CLK. Then, in step S301, if the operation mode is set to the pass-through mode, the host device 2 executes the same NAND single-unit test as described above in the pass-through mode. At this time, as indicated by hatching lines in FIG. 16, the operation of the controller 3c, excluding the second processing unit 31-2, can be halted since the supply of the clock CLK is stopped.

Thus, power consumption, which would occur due to standby current of the controller 3C at the time of the NAND single-unit test, can be eliminated, and the NAND single-unit test of the NAND-type flash memory 1c can be executed. As a result, the function test of the NAND-type flash memory 4 can advantageously be executed with higher precision.

Furthermore, in the memory card 1c according to the present embodiment, when the operation mode transitions to the pass-through mode, the second processing unit 31-2 supplies switch control signals to the access path setting unit 32a and clock path setting unit 78, thereby setting the access path and stopping the supply of the clock CLK. Therefore, there is no need to effect switching between the first operation mode and the pass-through mode in accordance with the mode signal that is input from a mode terminal which is an external connection pin.

As a result, there is no need to provide a mode terminal, and the advantage is obtained that the size of the whole memory card and the fabrication cost do not increase due to an increase in number of external connection pins. Moreover, since there is no need to adapt to the increase in number of external connection pins, there is the advantage that no alteration is required in the structure of the host device (tester) 2 which tests the memory card 1*c*.

Fourth Embodiment

FIG. 17 shows a memory card 1*d* according to a fourth embodiment of the present invention. The fourth embodiment of the invention relates to an example in which a plurality of NAND-type flash memories are mounted in the memory card 1*d*. The description of the parts common to the third embodiment is omitted here.

As shown in FIG. 17, the memory card 1*d* of this embodiment differs from the memory card of the third embodiment in that two NAND-type flash memories 4-1 and 4-2 are provided in the same chip. For example, the two NAND-type flash memories 4-1 and 4-2, together with the controller 1*d*, are stacked in the memory card 1*d* and mounted in the same chip.

<Pass-Through Mode Operation>

Next, the pass-through mode operation of the memory card 1*d* according to this embodiment is described with reference to FIG. 18 to FIG. 21. The description of the process overlapping the memory card test method according to the third embodiment is omitted here.

The operation flow is similar to that of the third embodiment. However, as shown in FIG. 18 to FIG. 21, the command sequence for transition to the pass-through mode in step S102 is different.

FIG. 18 shows a command sequence for transition in a case where the NAND single-unit test of the NAND-type flash memory 4-1 (chip 1) is to be conducted in the pass-through mode.

As shown in FIG. 18, in the memory card 1*d*, pass-through mode transition commands "CMD1", "CMD2", "CMD3" and "CMD4" and a chip selection command "CM-C1" are input to the I/O pins (D0 to D7: the 10th pin P10 to 17th pin P17) at timings at which the –WE pin goes high after the CLE pin goes high.

Thereafter, the same operation as in the above-described steps S105 to S108 is performed for the NAND-type flash memory 4-1.

FIG. 19, for instance, shows a command sequence in a case where the NAND single-unit test of the NAND-type flash memory 4-2 (chip 2) is to be conducted in the pass-through mode.

As shown in FIG. 19, in this case, in the memory card 1*d*, pass-through mode transition commands "CMD1" to "CMD4" and a chip selection command "CM-C2" are input to the I/O pins (D0 to D7: the 10th pin P10 to 17th pin P17) at timings at which the –WE pin goes high after the CLE pin goes high.

Thereafter, the same operation as in the above-described steps S105 to S108 is performed for the NAND-type flash memory 4-2.

Figure 20:
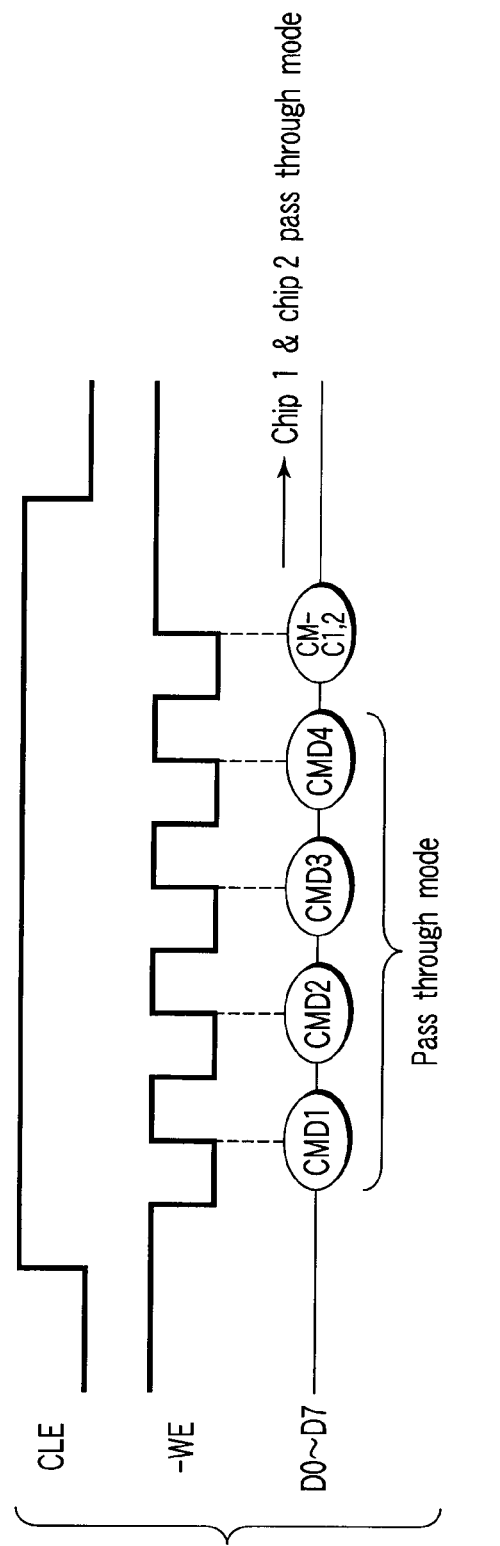
FIG. 20 shows an example of the command sequence for transition to the pass-through mode according to the fourth embodiment.

FIG. 20, for instance, shows a command sequence in a case where the NAND-type flash memory 4-1 and NAND-type flash memory 4-2 (chips 1 & 2) are to be tested in the pass-through mode.

As shown in FIG. 20, in the memory card 1*d*, pass-through mode transition commands "CMD1" to "CMD4" and a chip selection command "CM-C1,C2" are input to the I/O pins (D0 to D7: the 10th pin P10 to 17th pin P17) at timings at which the –WE pin goes high after the CLE pin goes high.

Thereafter, the same operation as in the above-described steps S105 to S108 is performed for the NAND-type flash memory 4-1 and NAND-type flash memory 4-2.

Figure 21:
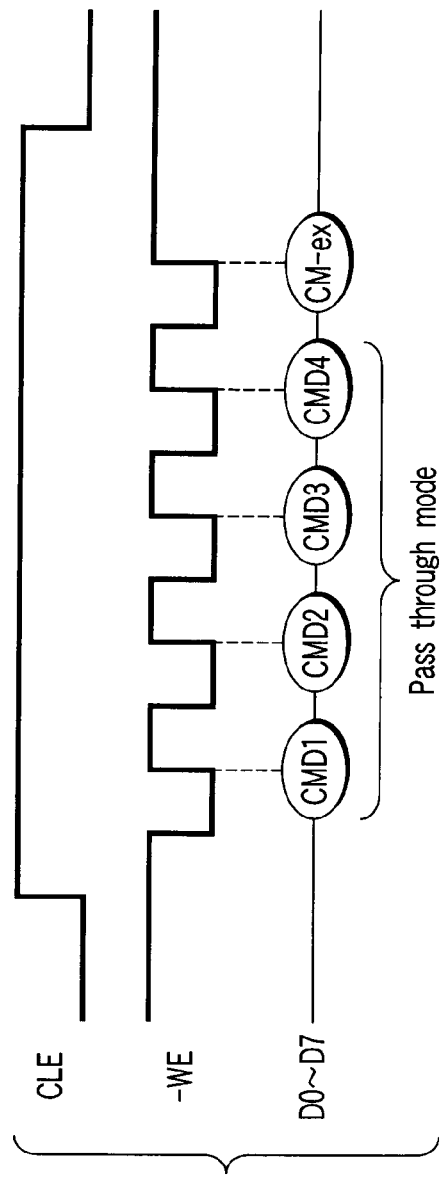
FIG. 21 shows an example of a command sequence for restoration according to the fourth embodiment.

FIG. 21, for instance, shows a command sequence in a case where the test in the pass-through mode for the NAND-type flash memories 4-1 and 4-2 (chip 1, chip 2) is finished.

As shown in FIG. 21, in the above-described step S104, in the memory card 1*d*, pass-through mode transition commands "CMD1" to "CMD4" and an end command "CM-ex" are input to the I/O pins (D0 to D7: the 10th pin P10 to 17th pin P17) at timings at which the –WE pin goes high after the CLE pin goes high.

According to the memory card 1*d* of this embodiment, the same advantageous effects as in the third embodiment can be obtained. Furthermore, the memory card 1*d* of this embodiment includes two NAND-type flash memories 4-1 and 4-2 in the same chip. Therefore, the memory capacity of the memory card can advantageously be increased.

The above-described access path setting unit 32*a* and clock path setting unit 78 are not realized by software processes, but are mounted in the memory card as hardware.

Other Embodiments

The present invention has been described above by referring to the first to fourth embodiments. However, the description and drawings, which constitute a part of the disclosure of the embodiments, should not be understood to restrict the scope of the present invention. Various alternative embodiments, as well as examples and techniques for implementation, will be clear from the disclosure to a person skilled in the art.

In the above-described first embodiment, the erase unit of the NAND-type flash memory 4 is set at 256 Kbytes. Alternatively, it is practically effective to adopt such a structure that the erase unit is, e.g., 128 Kbytes. In this case, the number of 128-Kbyte blocks is 1024.

In the first to fourth embodiments, the NAND-type flash memory 4 is used an example of the nonvolatile semiconductor memory. The invention, however, is applicable to other nonvolatile semiconductor memories, such as a NOR-type memory.

The NAND-type flash memory 4 and controller 3*a* may be mounted on a printed circuit board (PCB) as a hybrid integrated circuit, or may be integrated on the same semiconductor chip as a monolithic integrated circuit.

Further, the NAND-type flash memory 4 may be a 2-value memory which stores 1-bit information in one memory cell, or a multi-value memory which stores information greater than 1 bit (e.g., 2 bits) in one memory cell.

In the first to fourth embodiments, the erase block size of the NAND-type flash memory, which is assumed by the host device, is different from the erase block size of the actually used NAND-type flash memory. However, these block sizes may be set to be equal.

Besides, in the first to fourth embodiments, the host device executes access to the memory card by using physical addresses. Alternatively, the host device may execute access to the memory card by using logical addresses. In this case, in the first mode, the controller in the memory card converts a logical address, which is received from the host device, to a physical address of the NAND-type flash memory, and executes access to the NAND-type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a nonvolatile semiconductor memory;
a host interface which receives a command and a logical address or a physical address, which are output from a host device and has a pin structure corresponding to a pin structure of the nonvolatile semiconductor memory; and
a controller which operates in one of a first mode in which the controller converts the logical address which is received by the host interface to a physical address and accesses the nonvolatile semiconductor memory by using the physical address, and a second mode in which the host device accesses the nonvolatile semiconductor memory by using the physical address which is received by the host interface, the controller controlling switching between the first mode and second mode in accordance with the command.

2. The memory system according to claim 1, wherein the host interface receives a specific command sequence which is output from the host device, and
the controller effects the switching between the first mode and the second mode in accordance with the specific command sequence.

3. The memory system according to claim 1, wherein the controller includes an access path setting unit which sets an access path between the host device and the nonvolatile semiconductor memory at a time of power-on.

4. The memory system according to claim 1, wherein the controller processes, in the first mode, a command sequence which is issued by the host device on an assumption of an erase block size that is less than an erase block size of the nonvolatile semiconductor memory, and controls a write operation, a read operation and an erase operation for the nonvolatile semiconductor memory.

5. The memory system according to claim 1, wherein the controller includes a memory interface which is provided between the controller and the nonvolatile semiconductor memory; and
a buffer memory which temporarily stores data which is sent from one of the host device and the nonvolatile semiconductor memory.

6. The memory system according to claim 5, wherein the controller includes an access path setting unit which sets an access path between the host device and the nonvolatile semiconductor memory at a time of power-on and includes a first switch which is connected between the buffer memory and the host interface, and a second switch which is connected between the buffer memory and the memory interface, the first and second switches changing a connection between the host interface and the buffer memory and a connection between the memory interface and the buffer memory in accordance with switch control signals from a processing unit.

7. A controller comprising:
a host interface which receives a command and a logical address or a physical address, which are output from a host device and has a pin structure corresponding to a pin structure of a nonvolatile semiconductor memory; and
a processing unit which operates in one of a first mode in which the processing unit converts the logical address which is received by the host interface to a physical address and accesses the nonvolatile semiconductor memory by using the physical address, and a second mode in which the host device accesses the nonvolatile semiconductor memory by using the physical address which is received by the host interface, the processing unit controlling switching between the first mode and second mode in accordance with the command.

8. The controller according to claim 7, wherein the host interface receives a specific command sequence which is output from the host device, and the processing unit effects the switching between the first mode and the second mode in accordance with the specific command sequence.

9. The controller according to claim 7, further comprising an access path setting unit which sets an access path between the host device and the nonvolatile semiconductor memory at a time of power-on.

10. The controller according to claim 7, wherein the processing unit processes, in the first mode, a command sequence which is issued by the host device on an assumption of an erase block size that is less than an erase block size of the nonvolatile semiconductor memory, and controls a write operation, a read operation and an erase operation for the nonvolatile semiconductor memory.

* * * * *